(12) United States Patent
Lin et al.

(10) Patent No.: US 7,306,853 B2
(45) Date of Patent: Dec. 11, 2007

(54) PATTERNABLE LOW DIELECTRIC CONSTANT MATERIALS AND THEIR USE IN ULSI INTERCONNECTION

(75) Inventors: Qinghuang Lin, Yorktown Heights, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/314,307

(22) Filed: Dec. 21, 2005

(65) Prior Publication Data

US 2006/0105181 A1 May 18, 2006

Related U.S. Application Data

(62) Division of application No. 10/338,945, filed on Jan. 8, 2003, now Pat. No. 7,041,748.

(51) Int. Cl.
*C08L 83/04* (2006.01)
*B32B 27/06* (2006.01)
*B32B 9/04* (2006.01)
*C08G 77/04* (2006.01)

(52) U.S. Cl. .................. 428/447; 524/543; 524/588; 525/474; 528/25

(58) Field of Classification Search .............. 525/474; 428/447; 528/25
See application file for complete search history.

(56) References Cited

U.S. PATENT DOCUMENTS

| | | | |
|---|---|---|---|
| 5,290,899 A | 3/1994 | Tanaka et al. | |
| 5,338,818 A | 8/1994 | Brunsvold et al. | |
| 5,385,804 A | 1/1995 | Premlatha et al. | |
| 5,422,223 A | 6/1995 | Sachdev et al. | |
| 5,789,460 A | 8/1998 | Harkness et al. | |
| 5,820,944 A | 10/1998 | Harkness et al. | |
| 5,861,235 A | 1/1999 | Harkness et al. | |
| 5,891,529 A | 4/1999 | Harkness et al. | |
| 6,051,625 A | 4/2000 | Harkness et al. | |
| 6,087,064 A | 7/2000 | Lin et al. | |
| 6,096,483 A | 8/2000 | Harkness et al. | |
| 6,107,357 A | 8/2000 | Hawker et al. | |
| 6,187,505 B1 | 2/2001 | Lin et al. | |
| 6,191,183 B1 * | 2/2001 | Kobayashi et al. | 438/781 |
| 6,251,486 B1 | 6/2001 | Chandross et al. | |
| 6,258,506 B1 | 7/2001 | Harkness et al. | |
| 6,271,273 B1 | 8/2001 | You et al. | |
| 6,340,734 B1 | 1/2002 | Lin et al. | |
| 6,342,562 B1 | 1/2002 | Kozawa et al. | |
| 6,420,084 B1 | 7/2002 | Angelopoulos et al. | |
| 6,420,088 B1 | 7/2002 | Angelopoulos et al. | |
| 6,420,441 B1 | 7/2002 | Allen et al. | |
| 6,472,076 B1 * | 10/2002 | Hacker | 428/447 |
| 6,531,260 B2 | 3/2003 | Iwasawa et al. | |
| 6,576,345 B1 * | 6/2003 | Van Cleemput et al. | 428/447 |
| 6,653,045 B2 | 11/2003 | Angelopoulos et al. | |
| 6,762,501 B1 | 7/2004 | Park et al. | |
| 6,767,983 B1 * | 7/2004 | Fujiyama et al. | 528/26 |
| 6,873,026 B1 * | 3/2005 | Brunemeier et al. | 257/508 |
| 2003/0073040 A1 | 4/2003 | Iwasawa et al. | |
| 2003/0099899 A1 | 5/2003 | Gronbeck et al. | |

FOREIGN PATENT DOCUMENTS

JP 60080851 5/1985
JP 2000-281790 10/2000

OTHER PUBLICATIONS

Derwent Abstract of JP 2000-281790 A to Fujiyama and Teramoto entitled Silicone Resin with Triorganosilyl Linked to All or Part of Molecular Ends of Poly-Organo-Silsesquioxane, Jul. 27, 2004.*
Harkness, et al., "Demonstration of a Directly Photopatternable Spin-On-Glass Based on Hydrogen Silsesquioxane and Photobase Generators", *Macromolecules, American Chemical Society*, 1998, 31, pp. 4798-4805.

* cited by examiner

*Primary Examiner*—Randy Gulakowski
*Assistant Examiner*—John J. Figueroa
(74) *Attorney, Agent, or Firm*—Scully, Scott, Murphy & Presser, P.C.; Lisa U. Jaklitsch, Esq.

(57) ABSTRACT

The present invention relates to ultra-large scale integrated (ULSI) interconnect structures, and more particularly to patternable low dielectric constant (low-k) materials suitable for use in ULSI interconnect structures. The patternable low-k dielectrics disclosed herein are functionalized polymers that having one or more acid-sensitive imageable functional groups.

10 Claims, 3 Drawing Sheets

PATTERNABLE LOW DIELECTRIC CONSTANT MATERIALS AND THEIR USE IN ULSI INTERCONNECTION

RELATED APPLICATIONS

This application is a divisional of U.S. application Ser. No. 10/338,945, filed Jan. 8, 2003 now U.S. Pat. No. 7,041,748.

FIELD OF THE INVENTION

The present invention relates to ultra-large scale integrated (ULSI) interconnect structures, and more particularly to patternable low dielectric constant (low-k) materials suitable for use in ULSI interconnect structures. The patternable low-k dielectrics disclosed herein comprise a functionalized polymer having one or more acid-sensitive imageable functional groups. More specifically, the patternable low-k dielectrics of the present invention are based on acid-catalyzed photochemical transformation of silsesquioxane (SSQ)-type polymers under irradiation to achieve patterning capability which are then converted into a low-k material after curing. The present invention also provides a method of integrating the patternable low-k materials of the present invention in semiconductor back-end-of-the-line (BEOL) structures.

BACKGROUND OF THE INVENTION

Generally, semiconductor devices include a plurality of integrated circuits (ICs). ICs can be useful for many applications including computers and electronic equipment and they can contain millions of transistors and other circuit elements that can be fabricated on a single semiconductor chip. For device functionality, a complex of signal paths will typically be routed to connect the circuit elements distributed on the surface of the semiconductor device. Efficient routing of these signals across the device can become more difficult as the complexity and number of ICs is increased. Thus, the formation of multi-level or multi-layered interconnect schemes, including dual damascene, has become more desirable due to their efficacy in providing high-speed signal routing patterns between a large number of transistors on a single semiconductor chip.

In fabricating IC wiring with a multi-level scheme, an electrically insulating material (oftentimes referred to as a dielectric material) such as $SiO_2$, will normally be patterned to create openings for conductive lines and/or vias using photolithography and etching. These openings formed into the dielectric material are typically filled with a conductive material such as Cu or Al to interconnect the active device regions of the ICs. After the filling process, the semiconductor device is generally planarized by chemical-mechanical polishing. Interconnect structures of the dual damascene type are highly preferred in the industry.

The patterning of conventional insulating materials such as $SiO_2$ includes the use of many layers of different patterning and masking materials (typically up to 7 different layers of materials are employed in the prior art) that are formed atop the insulating layer prior to patterning. For example, a nitride hard mask, a silicon oxide hard mask, and a metal hard mask may all be used in patterning a single insulating layer of a typical interconnect structure. After forming the masking layers atop the insulating material, a photoresist and an anti-reflective coating are generally applied to the uppermost surface of the masking layers. The photoresist is then patterned by lithography and thereafter a series of etching steps are employed to first transfer the pattern from the photoresist to each of the masking layers and thereafter to the insulating layer. Furthermore, these masking layers have to be removed after patterning. Therefore, the prior art process of patterning a dielectric material is a very inefficient process.

In recent years, conventional insulating materials such as $SiO_2$ are being phased out and replaced with dielectric materials that have a low-dielectric constant (low-k) associated therewith. The term "low-k" denotes a dielectric material that has a dielectric constant lower than $SiO_2$, i.e., <3.9. For example, various polymer dielectrics such as polyarylenes and carbon-doped organosilicates have been developed and are currently being integrated into various IC interconnect structures. These low-k dielectrics are particularly advantageous for use as an interconnect dielectric because they significantly reduce signal delay and cross-talk in interconnect structures due to their lower dielectric constant.

Despite this advantage, prior art low-k dielectrics are typically photoinactive; therefore the patterning thereof requires the above mentioned multilayer masking scheme. Prior art multilayer masking schemes of the type mentioned above are extremely insufficient because: (i) they need many layers of sacrificial materials; (ii) each individual masking layer needs to be removed after patterning; (iii) the various masking layers sometimes increase the effective dielectric constant of the IC; and (iv) they increase integration complexity and manufacturing costs (i.e., a need for separate and expensive deposition and etching tools).

In addition, a separate photoresist is typically needed to pattern the same. Specifically, the patterning of prior art photoinactive low-k materials requires first patterning of the photoresist and thereafter various etching steps which transfer the pattern from the photoresist into each of the masking layers before ultimately patterning of the low-k dielectric.

In the prior art, silsesquioxane polymers containing base sensitive functional groups are known. See, for example, U.S. Pat. No. 5,789,460 to Harkness, et al.; U.S. Pat. No. 5,891,529 to Harkness, et al.; U.S. Pat. No. 5,820,944, to Harkness, et al.; U.S. Pat. No. 5,861,235 to Harkness, et al.; U.S. Pat. No. 6,096,483 to Harkness, et al.; U.S. Pat. No. 6,051,625 to Harkness, et al.; and U.S. Pat. No. 6,258,506 to Harkness, et al. The base catalyzed polymers described in the prior art suffer the following drawbacks: (i) they have a low resolution; (ii) they have a low sensitivity; and (iii) they do not provide a patterned low-k material.

In view of the state of the art mentioned hereinabove, there is a continued need for providing a low-k dielectric material that can be used as an inter-level or intra-level dielectric of an interconnect structure, yet does not require numerous materials (i.e., masking layers, photoresist and ARC) and processing steps for patterning the same. That is, a material is needed which combines the functions of a photoresist and a conventional low-k dielectric into a single material. Such a material would greatly reduce the integration complexity and processing steps required in the prior art to provide a patterned low-k interconnect dielectric. Separate photoresist (or masking layers) and related patterning processes (deposition and etching tools) would not be needed since the material would be capable of being patterned itself.

SUMMARY OF THE INVENTION

The present invention provides a composition of matter which includes a functionalized polymer having one or more acid-sensitive imageable groups. The polymers employed in the present invention are low-k polymers or polymers that can be converted into low-k polymers after subsequent processing, either by heat or light. More specifically, the polymers employed in the present invention include, but are not limited to: hydrocarbons, fluorinated hydrocarbons, organosilicates, silsesquioxanes and the like. Of these polymers, silsesquioxane-type polymers including caged, linear, branched or combinations thereof, are preferred, with caged silsesquioxane polymers being more highly preferred. The present invention also provides a method for synthesizing the caged silsesquioxane polymers.

The term "acid-sensitive" is used throughout the application to denote imageable functional groups which undergo a chemical reaction in the presence of an acid generated by a photoacid generator under exposure to radiation. The acid-sensitive imageable functional groups employed in the present invention may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief images after development. The positive-tone acid-sensitive functional groups are acid-sensitive protecting groups which cause the exposed region to be soluble in a developer to form positive-tone relief images after development. In the present invention, acid-sensitive negative-tone functional groups are preferred.

Examples of crosslinking functional groups include OH, epoxy, branched alcohols and SiH, while acid-sensitive protecting groups include high activation energy protecting groups such as branched alkyl tertiary ester groups, branched alkyl carbonyl groups and mixtures thereof, and low activation energy protecting groups such as tertiary acetals, tertiary ketals or tertiary silylethers.

The present invention also provides a patternable low-k composition which includes at least the composition of matter of the present invention, e.g., a functionalized polymer containing one or more acid-sensitive imageable functional groups. In such an embodiment, the patternable low-k composition of the present invention may be used in conjunction with at least an acid generator and/or a crosslinking agent. A solvent is also present in the patternable low-k composition of the present invention. Optional ingredients include, a base and a surfactant. The patternable low-k composition of the present invention is patterned by standard lithography processes or contacting printing processes and is converted into a low-k dielectric material by curing the same.

In another embodiment of the present invention, a pore-generating compound, called a porogen, is incorporated into the composition of matter, including the patternable low-k composition of the present invention. The porogen provides nanoscopic pores in the composition of matter of the present invention which further reduces the dielectric constant of the material.

The porogen that can be used in the present invention includes miscible or phase separated, i.e., non-miscible, polymers that are capable of decomposing under heat or radiation. Alternatively, the porogen may be extracted with supercritical fluid techniques. Examples of porogens that may be employed in the present invention include: homopolymers, copolymers, organic nanoscopic polymers, thermoplatic polymers, star-shaped polymers, dendrimers or crosslinked polymers that remain substantially dormant during the patterning process. After patterning, the pore generating polymers are decomposed or extracted to enhance the dielectric properties of the material of the present invention without severely degrading the pattern fidelity. The decomposition of the porogen may be by heat or radiation-induced.

In still yet another embodiment of the present invention, the composition of matter of the present invention may also include a non-silsesquioxane containing compound.

The inventive patternable low-k dielectric composition and material of the present invention can be used in standard single or dual damascene interconnect structures or etch back/gap fill and air bridge integration schemes.

The present invention also provides a method of forming an interconnect structure, particularly a dual damascene interconnect structure, which includes at least the patternable low-k dielectric material of the present invention as an inter-level and/or intra-level dielectric material.

The present invention also provides a film stack which includes a substrate, the patternable low-k material of the present invention, after coating and curing, atop the substrate, and an overlying layer located on the patternable low-k material. The patternable low-k material of the present invention preferably includes a conductive metal, such as Cu or Al, embedded therein.

It is noted that the term "patternable low-k composition" denotes the inventive composition of matter prior to curing, whereas the term "patternable low-k material" denotes the material that is formed after curing.

The patternable low-k dielectric material of the present invention offers several advantages over the state-of-the-art low-k materials including, for example:

Greatly reduced integration complexity and processing steps can be obtained: The patternable low-k dielectrics of the present invention combine the functions of a photoresist and a traditional low-k dielectric material into a single material. Therefore, patterning of the dielectric of the present invention can be accomplished on the dielectric itself. No separate photoresist and related processes (i.e., separate deposition and etching tools) are needed. This simplification greatly reduces the processing steps and costs required in the integration of low-k materials.

Highly-sensitive and high-resolution photo-patterned low-k materials can be obtained. Since the present invention utilizes a chemical amplification concept and polymers that are optical transparent to short wavelengths, patternable low-k materials suitable for 400 nm and below optical lithography, including I-line, 248 nm, 193 nm, 157 nm, EUV (13.4 nm) lithography, e-beam, and other lithography's are provided herein.

The present invention significantly reduces the processing steps in the integration of low-k dielectric materials by combining the functions of two separate and distinct materials into a single material. This is accomplished in the present invention by functionalizing a polymer with acid-sensitive imageable groups. The term "low-k" as used throughout the remaining portions of the present application denotes a dielectric material having a dielectric constant of less than 3.9, preferably less than 3.0.

DETAILED DESCRIPTION OF THE INVENTION

Figure 1A:
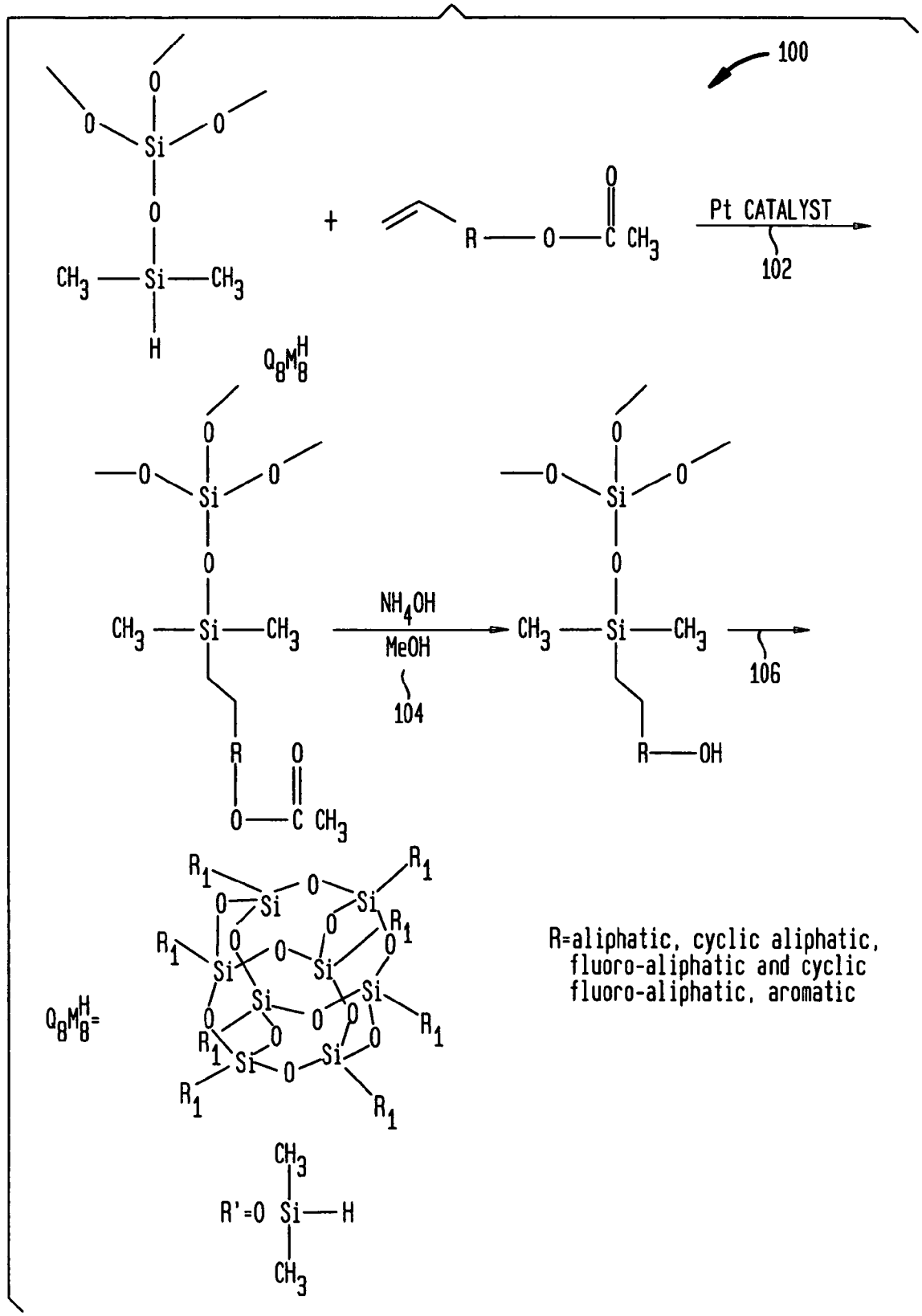
FIGS. 1A and 1B are schematic diagrams showing methods for synthesizing caged silsesquioxane polymers according to a preferred embodiment of the present invention.

The present invention provides a composition of matter that comprises a functionalized polymer having one or more acid-sensitive imageable functional groups. The polymer employed in the present invention includes hydrocarbons, fluorinated hydrocarbons, organosilicates, silsesquioxanes, and other like polymers that have a low-k or can be converted into a low-k material upon further treatment. Of these polymers, silsesquioxane-type polymers including caged, linear, branched, or combinations thereof, are preferred, with caged silsesquioxane polymers being more highly preferred. Unless otherwise stated, the functionalized polymer, particularly the positive-tone polymer, is made by well-known techniques which include the addition of the one or more acid-sensitive imageable functional groups to the polymer.

The acid-sensitive imageable functional groups employed in the present invention may include acid-sensitive positive-tone functional groups or acid-sensitive negative-tone functional groups. The negative-tone functional groups are functional groups for causing a crosslinking reaction (crosslinking can be effected by the functional group itself or by a crosslinking agent), while the positive-tone functional groups are acid-sensitive protecting groups. When negative-tone functional groups are employed, a photo-chemically generated acid catalyzes the crosslinking of the functional groups, either with or without an additional agent, to render the exposed area insoluble in a developer. Subsequently development with a proper developer generates negative-tone relief images. When positive-tone functional groups are employed, a photo-chemically generated acid catalyzes the deprotection of the acid sensitive protecting functional groups to render the exposed area soluble in a developer. Subsequently development with a proper developer generates positive-tone relief images.

Examples of crosslinking functional groups include OH, epoxy, branched alcohols and SiH, while acid-sensitive protecting groups include high activation energy protecting groups such as branched alkyl tertiary ester groups, branched alkyl carbonyl groups and mixtures thereof, and low activation energy protecting groups such as tertiary acetals, tertiary ketals or tertiary silylethers.

In a preferred embodiment of the present invention, the silsesquioxane polymer is a linear, branched, caged compound or combination thereof having the following structural formula:

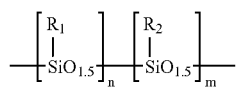

wherein each occurrence of $R_1$ is independently one or more acidic functional groups for base solubility; each occurrence of $R_2$ is independently one or more acid-sensitive imageable functional groups for crosslinking or an acid-sensitive protecting group; $R_1$ is not equal to $R_2$; m and n represent the number of repeating units; m is an integer; and n is zero or an integer greater than zero. Of these silsesquioxane polymers, caged structures are highly preferred in the present invention.

It is noted that when $R_2$ is one or more acid-sensitive functional groups for crosslinking, the resultant silsesquioxane polymer would behave as a negative-tone resist, i.e., the unexposed region would be removed by a resist developer after exposure. On the other hand, when $R_2$ is an acid-sensitive protecting group, then the resultant silsesquioxane polymer would behave as a positive-tone resist, i.e., the exposed regions would be removed by a resist developer after exposure. It is preferred in the present invention that the silsesquioxane polymer is a negative-tone material; i.e., that the polymer contains a $R_2$ group which has one or more acid-sensitive functional groups for crosslinking.

The silsesquioxane polymers of the present invention are not limited to any specific $R_1$ so long as $R_1$ is a group containing one or more acidic functional groups for base solubility. $R_1$ is preferably independently selected from among linear or branched alkyls which are substituted with —OH, —C(O)OH, and/or F; cycloalkyls which are substituted with —OH, —C(O)OH and/or —F; aromatics which are substituted with —OH, —C(O)OH, and/or —F; arenes that are substituted with —OH, —C(O)OH and/or —F; and acrylics that are substituted with —OH, —C(O)OH and/or F. Examples of preferred $R_1$ include:

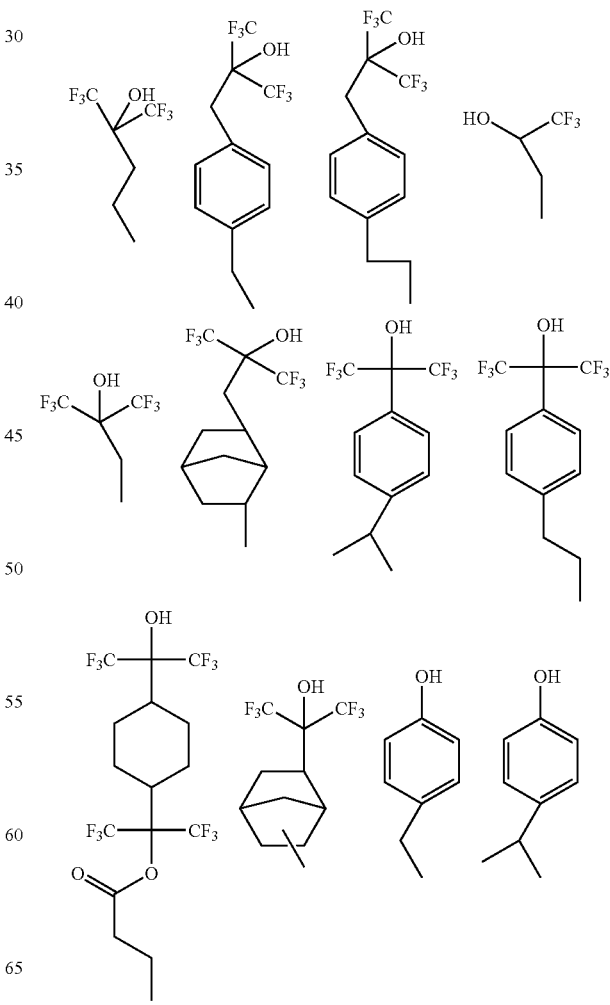

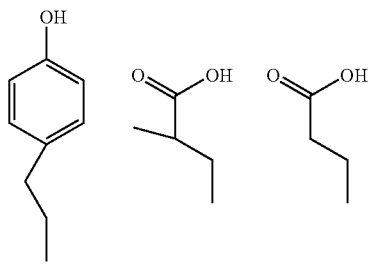
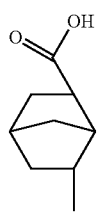

When R₂ is a group containing one or more acid-sensitive functional groups for crosslinking, R₂ may preferably include linear or branched alkyls that are substituted with —OH, epoxide, and/or —F; cyclo alkyls that are substituted with —OH, epoxide, and/or —F; cyclo aromatic that are substituted with —OH, epoxide, and/or —F; arenes that are substituted with —OH, epoxide, and/or —F. Illustrative examples of preferred R₂ crosslinking groups include:

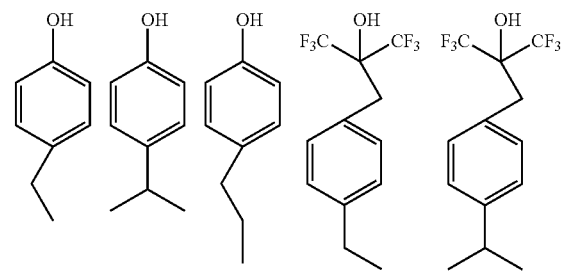
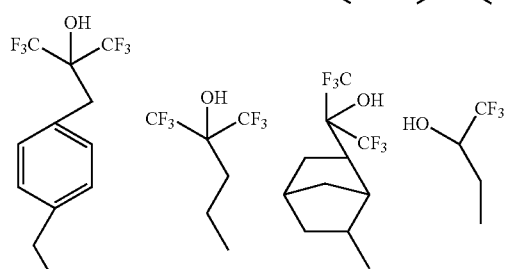
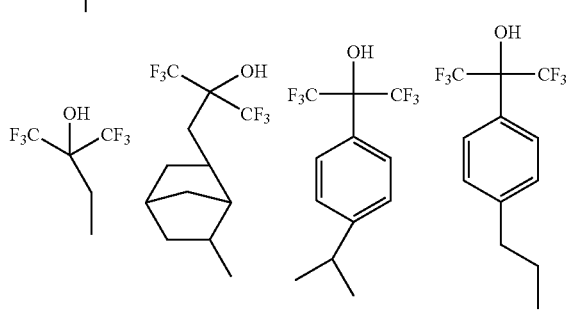

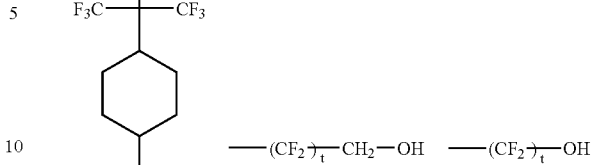
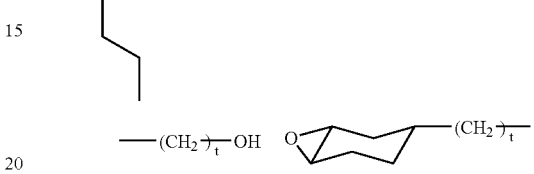
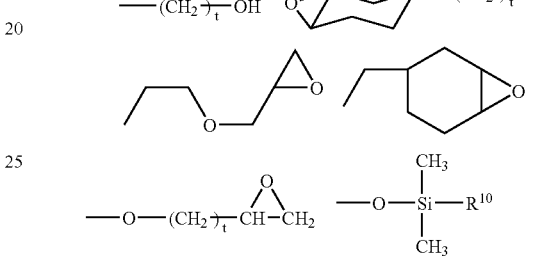

where $R^{10}$ is any $R_2$ group and t is from 1 to 20,

When R₂ is a group which includes an acid-sensitive protecting group, R₂ may include acid-sensitive protective groups such as cyclic or branched aliphatic carbonyls, or tertiary esters. Illustrative examples of R₂ groups include:

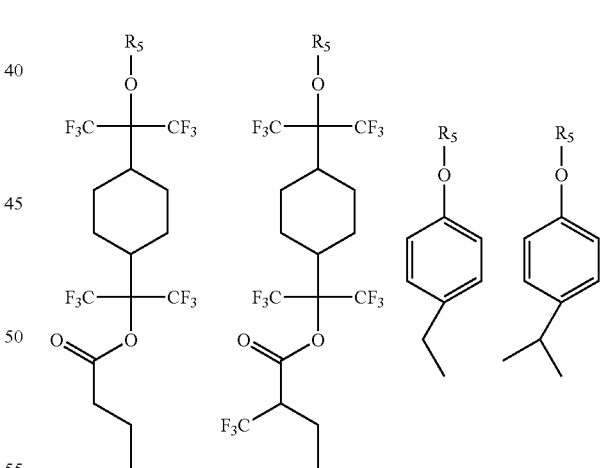
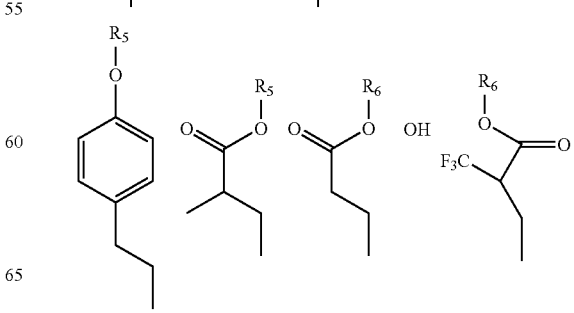

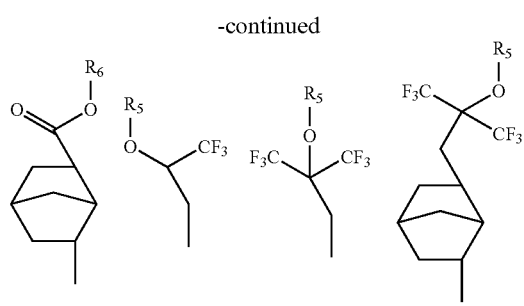

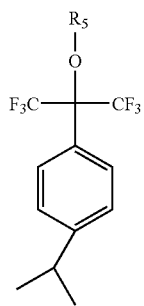

wherein $R_5$ and $R_6$ are conventional acid-sensitive protecting groups as mentioned above, i.e., cyclic or branched aliphatic carbonyls, tertiary esters or tertiary ethers.

In the general formula provided above, the variable m is greater than zero, and the numbers n and m are preferably selected such that $m/(n+m)$ equals 0.05 to 1.0, more preferably 0.4 to 1.0. The silsesquioxane polymers of the present invention have a weight averaged molecular weight of about 400 to about 500,000, more preferably, from about 800 to about 100,000, and even more preferably, from about 1500 to about 10,000. Preferably, the $R_1$ and $R_2$ structures and their proportions as well as the polymer molecular weight are selected to provide a suitable silsesquioxane for use in photolithographic applications. The properties of interest include solubility in aqueous alkaline solvents and thermal processing temperature as indicated by the glass transition temperature (Tg) of the polymer. In accordance with the present invention, the silsesquioxane polymers have a Tg between 30° and 400° C., more preferably between 60° and 300° C., and most preferably between 90° and 250° C.

Examples of the silsesquioxane polymers for negative-tone patterning of the present invention include:

poly(p-hydroxyphenylethylsilsesquioxane)(PHPES), poly(p-hydroxyphenylethylsilsesquioxane-co-p-hydroxy-α-methylbenzylsilsesquioxane)(PHPE/HMBS), poly(p-hydroxyphenylethysilsesquioxane-co-methoxybenzylsilsesquioxane) (PHPE/MBS), poly(p-hydroxyphenylethylsilsesquioxane-co-t-butylsilsesquioxane)(PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane)(PHPE/PS), poly(p-hydroxyphenylethylsilsesquioxane-co-bicycloheptylsilsesquioxane)(PHPE/BHS), poly(p-hydroxy-α-methylbenzylsilsesquioxane)(PHMBS), poly(p-hydroxy-α-methylbenzylsilsesquioxane-co-p-hydroxyphenylethylsilsesquioxane)(PHMB/HBS), poly(p-hydroxy-α-methylbenzylsilsesquioxane-co-methoxybenzylsilsesquioxane)(PHMB/MBS), poly(p-hydroxy-α-methylbenzylsilsesquioxane-co-t-butylsilsesquioxane)(PHMB/BS), poly(p-hydroxy-α-methoylbenzylsilsesquioxane-co-cyclohexylsilsesquioxane) (PHMB/CHS), poly(p-hydroxy-α-methylbenzylsilsesquioxane-co-phenylsilsesquioxane) (PHMB/PS), poly(p-hydroxy-α-methylbenzylsilsesquioxane-co-bicycloheptylsilsesquioxane)(PHMB/BHS), and poly(p-hydroxybenzylsilsesquioxane-co-p-hydroxyphenylethylsilsesquioxane)(PHB/HPES).

Further examples of negative-tone silsesquioxane polymers include:

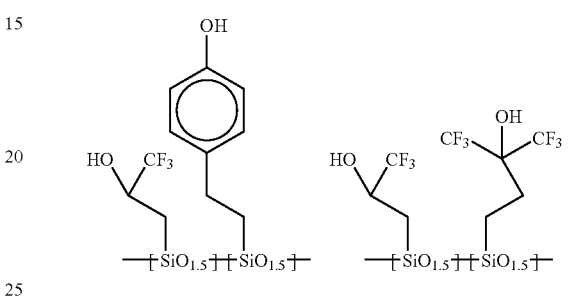

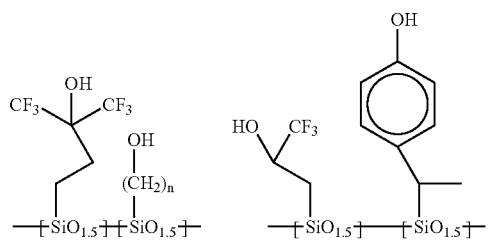

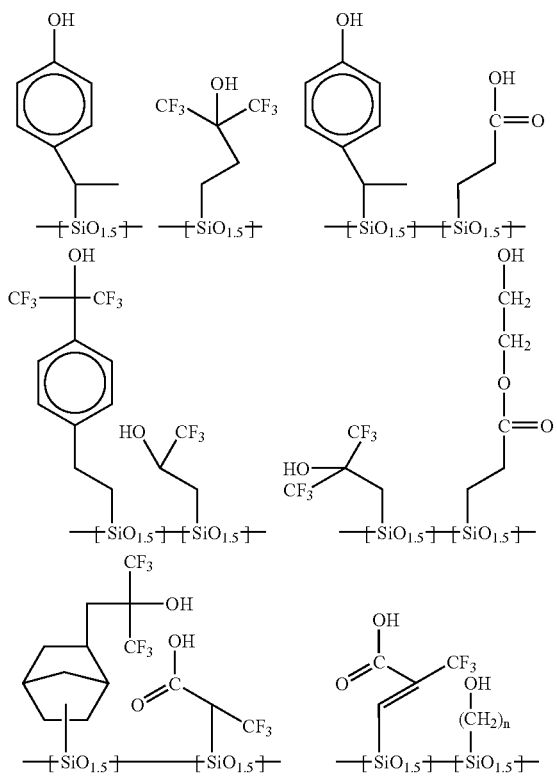

-continued
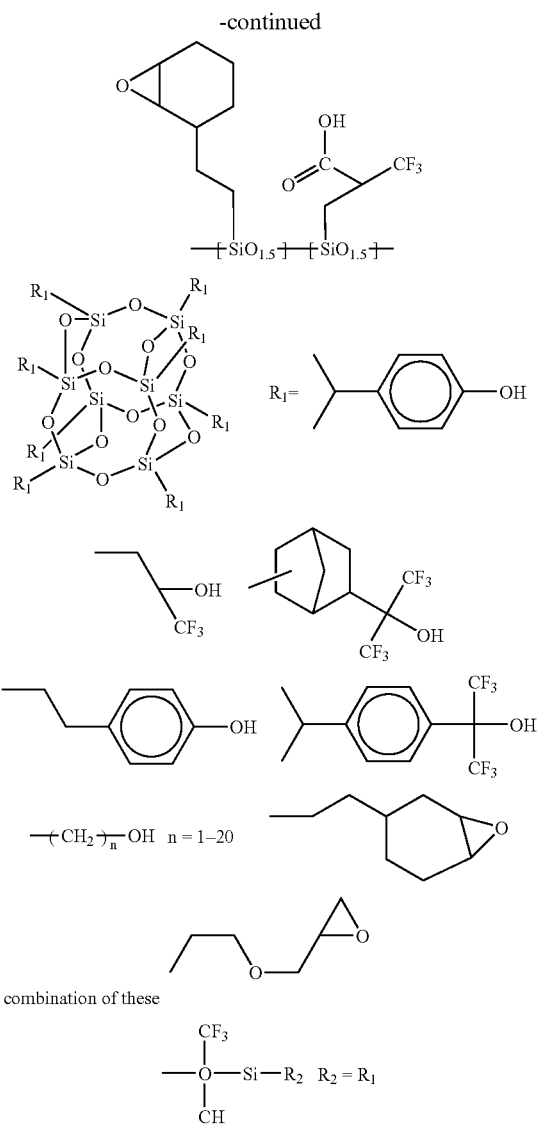
or combination of these
Examples of positive-tone silsesquioxane polymers include:
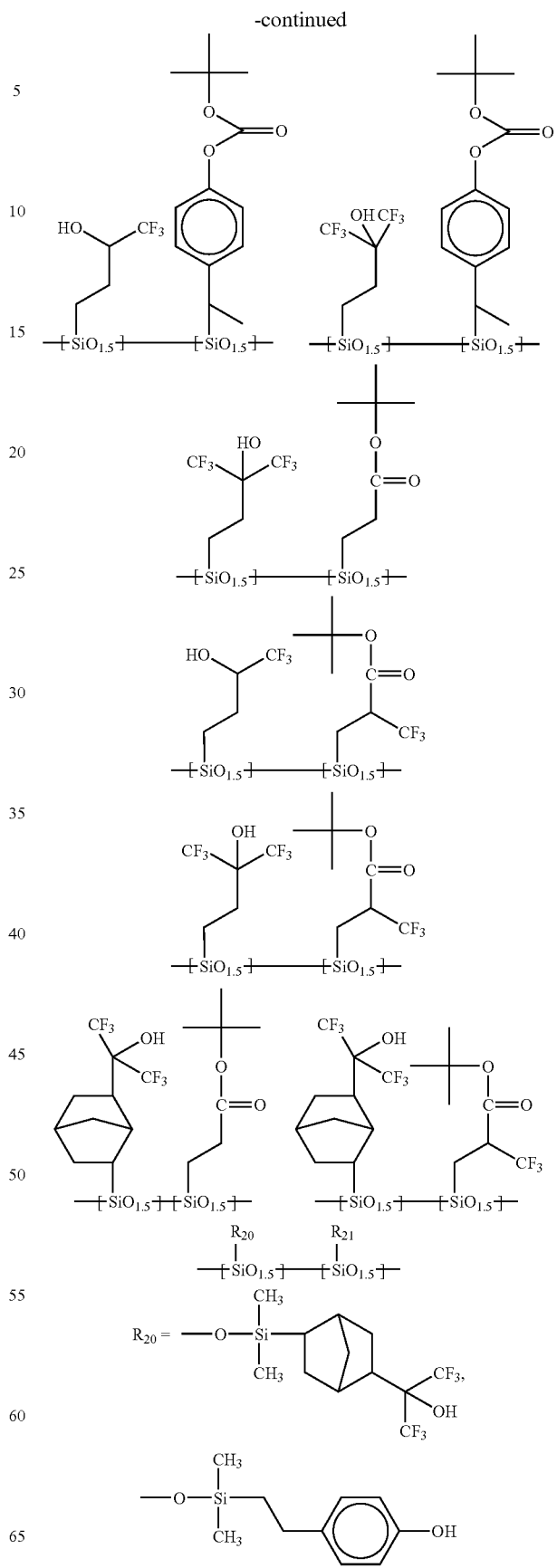
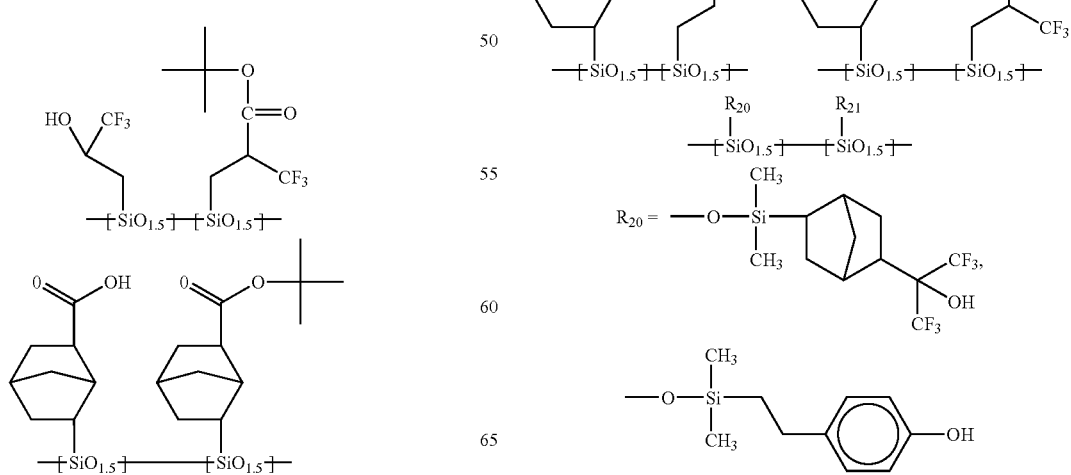

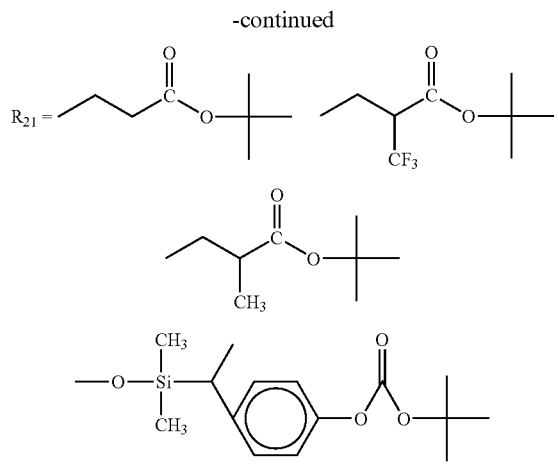

In one embodiment of the present invention the silsesquioxane polymer is a compound having the formula:

$$-\left(\underset{\underset{x}{|}}{\overset{R_1}{SiO_{1.5}}}\right)_x\left(\underset{\underset{|}{|}}{\overset{R_2}{SiO_{1.5}}}\right)_y\left(\underset{\underset{|}{|}}{\overset{R_3}{SiO_{1.5}}}\right)_z-$$

wherein $R_1$ and $R_2$ are as defined above; $R_3$ does not equal $R_1$ or $R_2$ and is a group capable of further improving electrical and/or mechanical and/or thermal-mechanical and/or lithograph performance of the polymer; and x, y and z represent the number of repeating units and are integers. $y/(x+y+z)$ is 0.01-1, $(x+y)/(x+y+z)$ is 0.05-1, Preferably, $R_3$ is a sacrificial group capable of further reducing dielectric constant of the resultant low-k composition by generating nanoscopic pores in the polymer resin during curing. $R_3$ is independently alkyl, aryl, cycloalkyl, alkoxy, aryloxy, cycloalkoxy and their fluorinated moieties. Specifically, $R_3$ is linear or branched alkyl, aryl or substituted aryl, cycloalkyl or substituted cycloalkyl, linear or branched alkoxy, aryloxy or substituted aryloxy, cycloalkoxy or substituted cycloalkoxy and their fluorinated moieties comprising 1-40 carbon atoms.

Examples of $R_3$ are

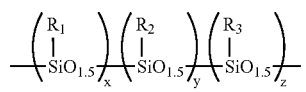

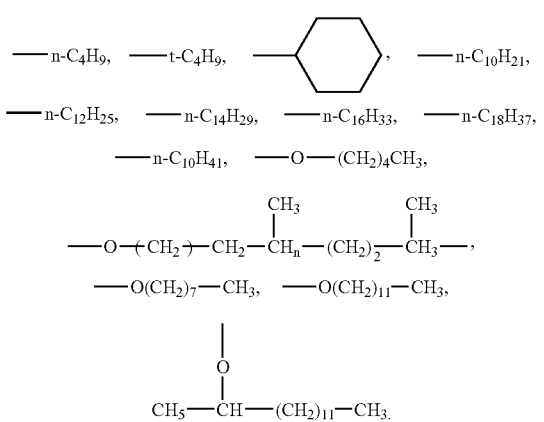

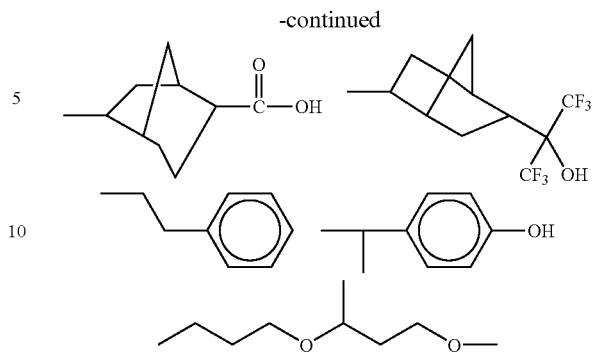

Figure 1B:
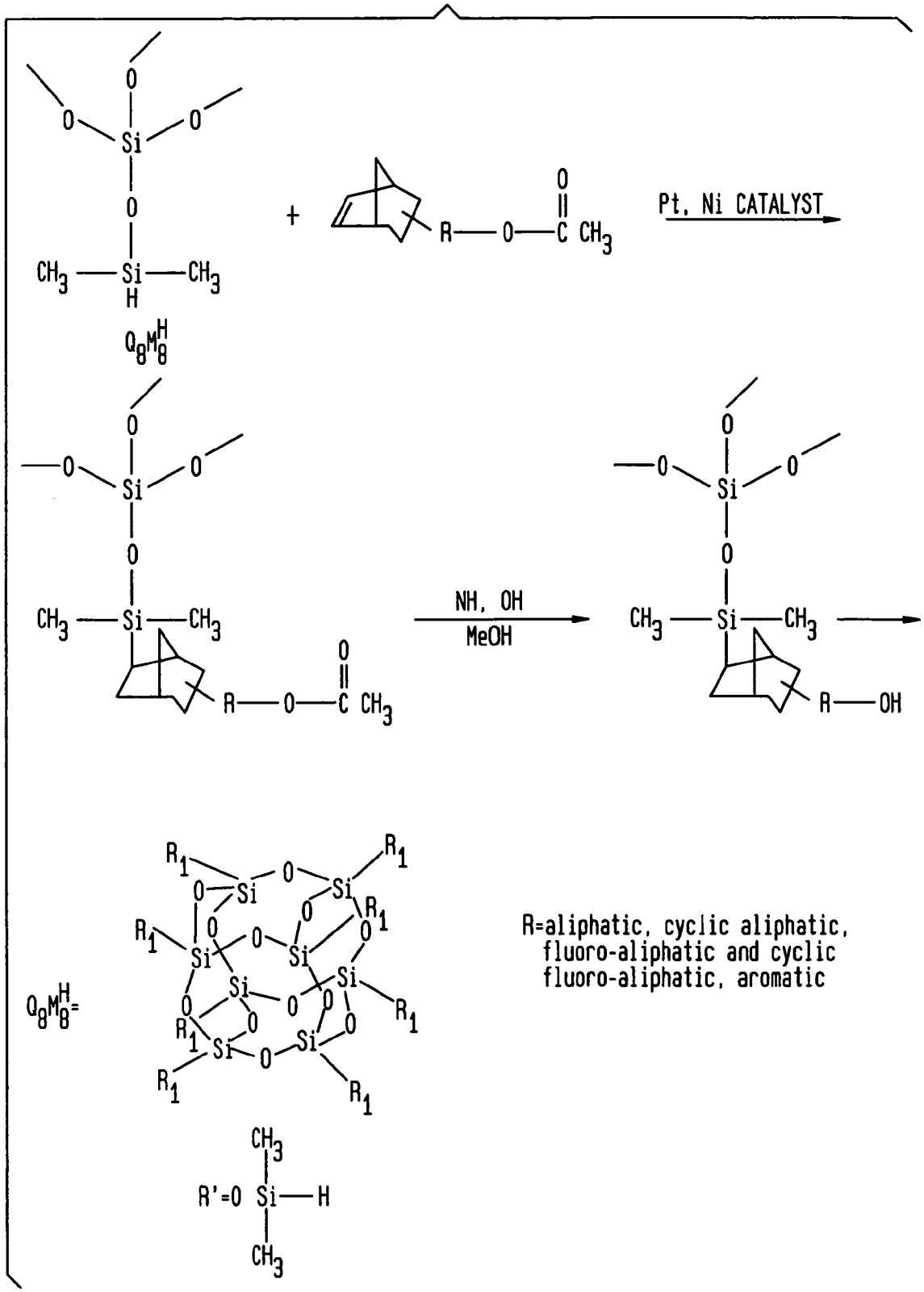

Referring now to FIGS. 1A-1B, the present invention also includes a method 100 for synthesizing functionalized caged silsesquioxane polymers from caged silsesquioxane precursors or condenstation of multi-functional siloxane into a caged silsesquioxane.

The synthesis method of the invention is preferably started from using a caged silsesquioxane with at least one active hydrosilane moiety, such as octakis(dimethylsilyloxy) silsesquioxane, and a compound including a protected base-soluble moiety such as hydroxyl, and an alkenyl or cyclic alkenyl moiety. The alkenyl moiety is then hydrosilylated with a Ni or Pt catalyst and the resulting silicon-containing compound is then converted into caged silsesquioxane with a hydroxyl group by hydrolyzing the protected hydroxyl moiety on the silsesquioxane compound.

Specifically, according to FIGS. 1A-1B, the preferred methods begin with hydrolysilation 102 of a caged silsesquioxane compound with active hydrosilane moiety(ies) with a compound including a based-soluble moiety and an alkenyl or cyclic alkenyl moiety to form a caged silsesquioxane with a protected hydroxyl moiety. Preferably, R includes alkyls, branched alkyls, cyclic alkyls, fluorinated alkyls, fluorinated branched alkyls, fluorinated cyclic alkyls, that have a least one carbon atom, preferably 2 carbon atoms. Also, preferably, the protected hydroxyl moiety is selected from among $R_{35}$—COO—, $R_{36}$—O, $R_{37}$—O—COO—, and other protected moieties that may be selectively converted to form bases-soluble (hydroxyl) functionality wherein $R_{35}$ is selected from among H, alkyl, aryl, and combinations thereof, and $R_{36}$ is selected from alkyl, aryl, silyl, and combinations thereof. In other words, the protected base-soluble (hydroxyl) moiety may be a compound bound by an ester linkage, ether linkage or carbonyl linkage to the R compound.

The protected base-soluble (hydroxyl) moiety is more preferably bound by an ester linkage, since it can be converted to a base-soluble (hydroxyl) moiety by hydrolysis, however, an ether linkage may also be converted with somewhat more difficulty by dealkylation. Other protected base-soluble (hydroxyl) moieties are also conceivable that can be selectively converted to form hydroxyl functionality. A more preferred hydroxyl moiety is an acetoxy protecting group.

A few examples of hydrosilylation catalysts include hydrogen hexachloroplatinate (IV), di-µ-carbonyl-π-cyclopentadienylnickel, a platinum-carbonyl complex, a platinum divinyltetramethyldisiloxane complex, and a platinum-cyclovinylmethylsioxane complex.

Next, in step 104, the resultant caged silsesquioxane with protected base-soluble (hydroxyl) moiety is then reacted with ammonium hydroxide to remove the protecting group to give a base-soluble caged silsesquioxane 106.

Alternatively, a mixture of different compounds with different protected base-soluble moieties and different alkenyl or cyclic alkenyl moieties may be used to form a caged silsesquioxane with different base-soluble caged silsesquioxane copolymers, terpolymers, or multifunctional polymers.

The composition of the present invention may also contain a polymer component which is a blend of a silsesquioxane polymer with a non-silsesquioxane polymer, most preferably a non-silsesquioxane polymer which is substantially free of silicon in its backbone structure. Preferably, the non-silsesquioxane polymer is selected to provide a patternable low-k material having a higher $T_g$ than the silsesquioxane polymer alone. A description of the blended polymers will now be provided.

In the compositions containing the blended polymer component, the silsesquioxane polymer in the blend may be selected from the novel silsesquioxane polymers described above or may be selected from other silsesquioxane polymers such as poly(p-hydroxybenzylsilsesquioxane)(PHBS), poly(p-hydroxybenzylsilsesquioxane-co-methoxybenzylsilsesquioxane)(PHB/MBS), poly(p-hydroxybenzylsilsesquioxane-co-t-butylsilsesquioxane)(PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane)(PHB/PS), poly(p-hydroxybenzylsilsesquioxane-co-bicycloheptylsilsesquioxane)(PHB/BHS), and caged silsesquioxanes such as octakis(glycidyloxypropyl)dimethylsilyloxy)silsesquioxane, octakis[cyclohexenyl epoxide)dimethylsilyloxy}silsesquioxane, octakis[4-(hydroxyphenylethyl)dimethylsilyloxy]silsesquioxane, and octakis[{2-(1',1'-bis(trifluoromethyl)-1'-hydroxyethyl)norbornyl}dimethylsilyloxy]silsesquioxane. If desired, a combination of different silsesquioxane polymers may be used in the blend with the non-silsesquioxane polymer.

The non-silsesquioxane polymer is substantially miscible or non-miscible, preferably substantially miscible, with the silsesquioxane polymer. Preferably, the non-silsesquioxane polymer is selected from the group consisting of base soluble polymers and polymers that are optically transparent at 365 nm or below. Illustrative examples of non-silsesquioxoane polymers that are optical transparent at 248 nm include: polyhydroxystyrene (PHS), poly(cyclo-olefins), or other polymers containing hydroxystyrene and/or cyclo-olefin monomers. These polymers may be fluorinated polymers. More preferably, the non-silsesquioxane polymer that is optical transparent at and below 248 nm is selected from among polymers having the chemical formula:

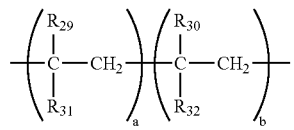

wherein each occurrence of $R_{29}$ or $R_{30}$ is preferably independently selected from among H, $CH_3$, $C_2$ or higher alkyl, or halogen. Each occurrence of $R_{31}$ is preferably independently selected from hydroxyphenyl, cycloalkyl or fluorinated cycloalkyl with a cross-linkable functionality or acid-sensitive protecting group. Each occurrence of $R_{32}$ is preferably independently selected from among phenyl, hydroxyphenyl, cycloalkyl, fluorinated cycloalkyl, hydroxycyclohexyl, and —COO—$R_{33}$—OH, wherein $R_{33}$ may be alkyl, cycloalkyl, aryl or fluorinated alkyl, fluorinated cycloalkyl or fluorinated aryl and $R_{30}$ may not be halogen when $R_{32}$ is —COO—$R_{33}$—OH.

As indicated above by the moieties listed for $R_{29}$ and $R_{30}$, the vinyl moiety of each monomer may also include a methyl or halogen moiety. The numbers a and b are preferably selected such that a/(a+b) equals 0.4 to 1.0. $R_{29}$, $R_{30}$, $R_{31}$, $R_{32}$, a, and b are preferably selected such that the non-silsesquioxane polymer or its deprotected products is base soluble and substantially miscible in a blend with the silsesquioxane polymer. Preferably, any hydroxyl moieties in $R_{31}$ or $R_{32}$ are in a para-position; thus, 4-hydroxyphenyl is more preferred for $R_{31}$. If desired, any aromatic rings of $R_{31}$ or $R_{32}$ shown in the above structure may be additionally substituted, provided the substitution does not prevent the non-silicon-containing compound from being base soluble or substantially miscible in the polymer blend. For example, the $R_{31}$ hydroxyphenyl may include multiple hydroxyl moieties instead of just one. Most preferably, the non-silsesquioxane polymer is selected from among the following polymers: poly(4-hydroxystyrene), poly(4-hydroxystyrene-co-styrene), poly(4-hydroxystyrene-co-4-vinylcyclohexanol), poly(4-hydroxystyrene-co-acrylic acid hydroxymethyl ester), poly(4-hydroxystyrene-co-acrylic acid hydroxyethyl ester), poly(cycloolefins)-co-maleic anhydridr, poly(5-[2-trifluoromethyl-1,1,1-trifluoro-2-hydroxypropyl]-norbornene-co-trifluoromethylmethacrylic acid), poly(5-[2-trifluoromethyl-1-1-1-trifluoro-2-hydroxylpropyl]-2-norbornene-co-t-butyl α-trifluoromethyl acrylate), poly (1,1,1,3,3,3-hexafluoro-2-hydroxypropyl styrene), poly(α-trifluoromethyl methacrylic acid-co-β-hydroxyethyl acrylate), and poly(α-trifluoromethyl methacrylic acid-co-β-hydroxyethyl methacrylate).

The polymers, copolymers, and terpolymers comprising the following monomers may be used for lithography below 248 nm:

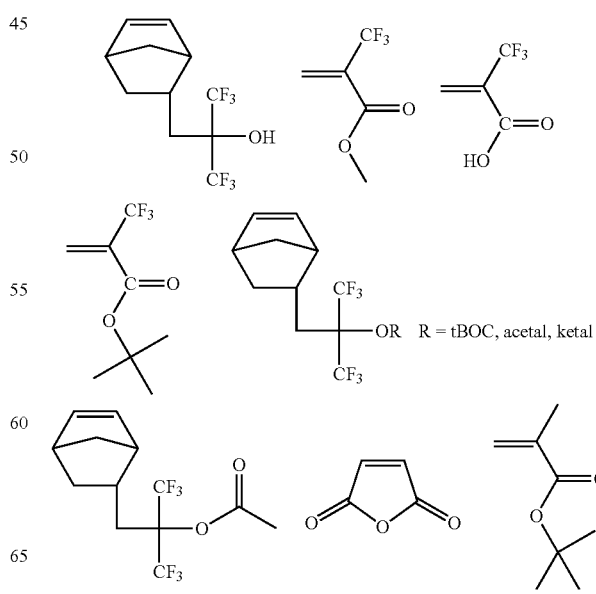

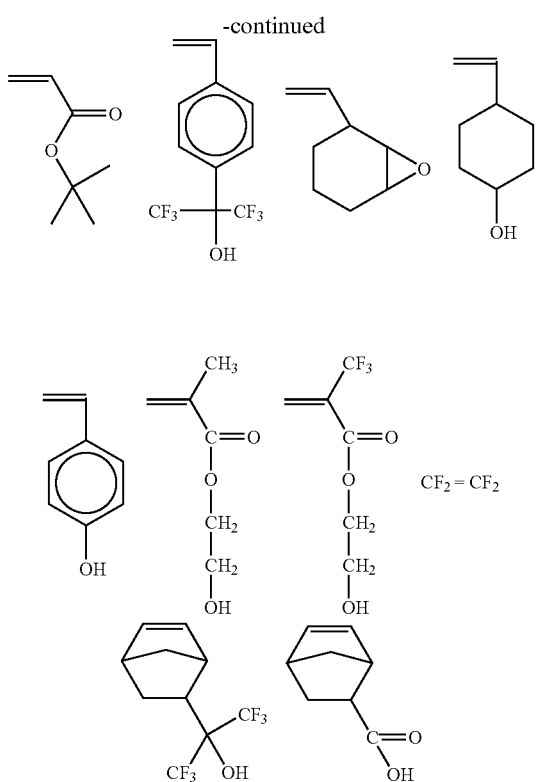

The average molecular weight of the non-silsesquioxane polymer is preferably is about 1,000 to 100,000, more preferably about 2,000 to 50,000, most preferably about 3,000 to 25,000. The above mentioned polymer blends are made using techniques that are well known to those skilled in the art. The non-silsesquioxane is present in an amount from 0 to about 95 wt. %.

In addition to improved thermal characteristics, the blending of the described silsesquioxane polymer and non-silsesquioxane polymer according to the present invention preferably results in a modulation of the dissolution properties of the corresponding patternable low-k composition that compared to a patternable low-k composition which is free of non-silsesquioxane polymer. Typically, the modulation is in the form of increasing or decreasing the dissolution rate as compared to a patternable low-k composition which is free of non-silsesquioxane polymer. For example, a caged silsesquioxane with epoxide functional group may be made patternable in aqueous base developer by blending with acidic non-silsesquioxane polymers such as poly(p-hydroxystyrene).

Thus, the polymer blends and the resulting patternable low-k compositions of the present invention are preferably suitably soluble (prior to radiation exposure for negative-tone and after exposure for positive-tone) in aqueous alkaline developers such as 0.14 N and 0.26 N tetramethylammonium hydroxide (TMAH). More preferably, the polymer blends and the patternable low-k compositions of the present invention are suitably soluble in higher normality aqueous alkaline solutions, such as solutions of at least about 0.20 N, most preferably at least about 0.26 N.

Advantageously, the $T_g$ benefit and the improved dissolution control benefit can be achieved in the same patternable low-k composition using a polymer blend of the present invention. Preferably, the polymer component contains about 30 to 100 wt. % silsesquioxane polymer based on the total weight of the polymer component, more preferably about 60 to 90 wt. % silsesquioxane polymer.

In addition to the above-mentioned benefits, the blending of the silsesquioxane polymer and non-silsesquioxane polymer may advantageously increase the number of available cross linking sites in the overall patternable low-k composition if the non-silsesquioxane polymer contains a larger number of cross linking sites per repeating unit than does the selected silsesquioxane polymer. Such an increase provides a higher cross linking efficiency during exposure of patternable low-k composition containing such blends.

The present invention further relates to novel and improved negative and positive photo-sensitive patternable low-k compositions. The negative-tone photo-sensitive patternable low-k compositions of the present invention generally comprise a functionalized polymer having one or more acid-sensitive imageable crosslinking groups, a photosensitive acid generator, a solvent and, optionally, an acid-sensitive crosslinking component and/or a pore generator. The polymer component may preferably be one of the novel silsesquioxane polymers described above. The polymer component may also preferably be a blend of a silsesquioxane polymer with a non-silsesquioxane polymer, most preferably a non-silsesquioxane polymer which is substantially free of silicon in its backbone structure.

The positive-tone photo-sensitive patternable low-k compositions of the present invention generally comprise a functionalized polymer having one or more acid-sensitive imageable protecting group; a photosensitive acid generator, a solvent and, optionally, a pore generator. The polymer component may preferably be one of the novel silsesquioxane polymers described above. The polymer component may also preferably be a blend of a silsesquioxane polymer with a non-silsesquioxane polymer, most preferably a non-silsesquioxane polymer which is substantially free of silicon in its backbone structure.

In the negative-tone patternable low-K composition, the crosslinking component used in the present invention may be any suitable crosslinking agent known in the negative photoresist art which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethylglycoluril, available under the POWDERLINK trademark from American Cyanamid Company. Other possible crosslinking agents include: 2,6-bis(hydroxymethyl)-p-cresol, compounds having the following structures:

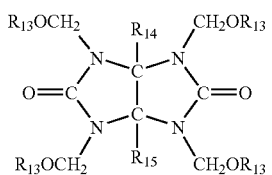

wherein $R_{13}$ is $CH_3$ or $CH_2CH_3$; and $R_{14}$ and $R_{15}$ are each independently a $C_1$-$C_8$ alkyl or aryl hydrocarbon;

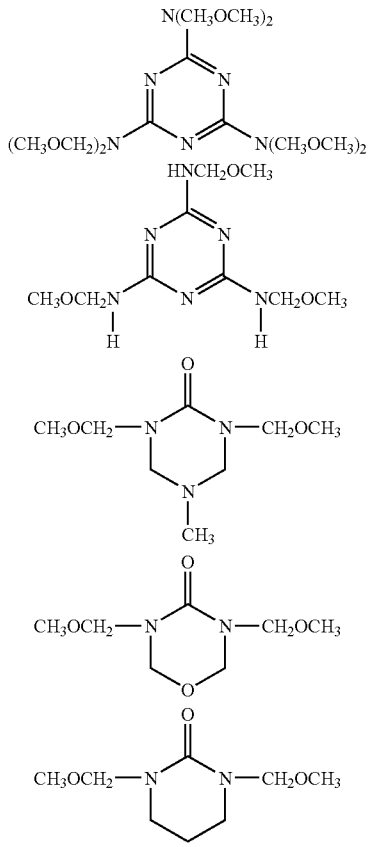

including their analogs and derivatives, such as those found in Japanese Laid-Open Patent Application (Kokai) No. 1-29339, as well as etherified amino resins, for example methylated or buylated melamine resins (N-methoxymethyl- or N-butoxymethyl-melamine respectively) or methylated/butylated glycolurils, for example as can be found in Canadian Patent No. 1 204 547. Combinations of crosslinking agents may be used.

The optional pore generators, i.e. porogens, used in the present invention are thermally liable polymers which are removed from the low-k material of the present invention by decomposition, either by thermal means or by ionizing radiation induced decomposition or by super critical fluid, such as supercritical $CO_2$, extraction, leaving stable nano-sized pores within the resultant low-dielectric film.

The optional porogens that may be employed in the present invention include a block copolymer wherein one of the blocks is compatible with the crosslinked matrix resin and the other block is incompatible therewith. The porogens may also be diblock copolymers or triblock polymers. Useful monomers for such copolymers include: styrene, α-methylstyrene, p-hydroxystyrene, p-[hexafluorohydroxypropyl styrene, 5-(2-trifluoromethyl-1-1-1-trifluoro-2-hydroxypropyl] 2-norbornene, acrylonitriles, ethylene oxides, propylene oxides, ethylenes, acetic acids, siloxanes, caprolactones, urethanes, methacrylates, acrylates, butadienes, isoprene, vinyl chlorides, and acetals, and amine-capped alkylene oxides (commercially available as Jeffamine™ polyether amines from Huntsman Corp.).

Other examples of porogens that may be employed in the present invention include: thermoplastic homopolymers and random (as opposed to block) copolymers. The term "homopolymer" denotes a compound comprising repeating units from a single monomer. Suitable thermoplastic materials include, but are not limited to: polystyrenes, polyacrylates, polymethacrylates, polybutadienes, polyisoprenes, poly(phenylene oxides), poly(propylene oxides), poly(ethylene oxides), poly (dimethylsiloxanes), polytetrahydrofurans, polyethylenes, polycyclohexylethylenes, polyethyloxazolines, polyvinylpyridines, polycaprolactones, polyacetic acids, poly(4-hydroxystyrene), poly(4-hydroxystyrene-co-styrene), poly(4-hydroxystyrene-co-4-vinylcyclohexanol), poly(4-hydroxystyrene-co-acrylic acid hydroxymethyl ester), poly(4-hydroxystyrene-co-acrylic acid hydroxyethyl ester), poly(cycloolefins-co-maleic anhydride), poly(5-[2-trifluoromethyl-1,1,1-trifluoro-2-hydroxypropyl]-norbornene-co-trifluoromethyl methacrylic acid), poly[5-[2-trifluoromethyl-1-1-1-trifluoro-2-hydroxylpropyl]-2 norbornene-co-t-butyl α-trifluoromethyl acrylate, poly [1,1,1,3,3,3-hexafluoro-2-hydroxypropyl styrene, poly [α-trifluoromethyl methacrylic acid-co-β-hydroxyethyl acrylate], and poly[α-trifluoromethyl methacrylic acid-co-β-hydroxyethyl methacrylate], copolymers of these materials and mixtures thereof. The thermoplastic materials may be linear, branched, hyperbranched, dendritic, or star like in nature or combinations thereof.

The porogen may also be a material that has an average diameter of from about 1 to about 50 nm. Examples of such materials include dendrimers (available through Dendritech, Inc.), hyperbranched polymer systems, latex polymers, star shaped and dendritic polymers. These materials may be non-reactive with the crosslinkable matrix precursor, or reactive as described above. For reactive incorporation, this may be due to functionality directly incorporated into the porogen or alternatively via a linker capable of reacting with both the resin and the porogen.

When a porogen is employed, it is present in the composition of the present invention in an amount of from about 0.1 to about 99.9%, based on 100% of the functionalized polymer. More preferably, the porogen is present in an amount of from about 5 to about 90%, based on 100% of the functionalized polymer.

The photosensitive acid generators (PAGs) used in the present invention may be any suitable photosensitive acid generator known in the resist art that is otherwise compatible with the other selected components of the patternable low-k composition of the present invention. Examples of preferred photosensitive acid generators (PAG) include: -(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,371,605. The content of the '605 patent is incorporated herein by reference. Also, a PAG that produces a weaker acid such as dodecane sulfonate of N-hydroxynaphthalimide ("DDSN") may be used. Combinations of PAGs may be used.

In addition the above components, the patternable low-k composition of the invention generally include a casting solvent to dissolve the other components so that the overall composition may be applied evenly on the substrate surface to provide a defect-free coating. Example of suitable casting solvents include: ethoxyethylpropionate ("EEP"), a combination of EEP and γ-butyrolacetone ("GBL"), propyleneglycolmonoethylether acetate (PGMEA), and ethyl lactate. Combinations of these solvents may be used. The present invention is not limited to selection of any particular solvent.

The patternable low-k compositions may further include an organic base additives, surfactants, sensitizers or other expedients known in the art. The compositions of the present invention are not limited to any specific selection of these expedients.

Examples of base additives include: dimethylamino pyridine, 7-diethylamino-4-methyl coumarin ("Coumarin 1"), tertiary amines, proton sponge, berberine, and the polymeric amines as in the PLURONIC or TETRONIC series from BASF. Tetra alkyl ammonium hydroxides or cetyltrimethyl ammonium hydroxide may be used as a base additive when the PAG is an onium salt.

Examples of possible surfactants include fluorine-containing surfactants such as FLUORAD FC-430 available from 3M Company in St. Paul, Minn., and siloxane-containing surfactants such as the SIL WET series available from Union Carbide Corporation in Danbury, Conn.

Examples of sensitizers include chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605. The sensitizer may include oxygen or sulfur. The preferred sensitizers will be nitrogen free, because the presence of nitrogen, e.g., an amine or phenothiazine group, tends to sequester the free acid generated during the exposure process resulting in loss of photosensitivity.

The patternable low-k compositions of the invention are not limited to any specific proportions of the various components. Where the compositions of the invention contain a solvent, the compositions preferably contain about 2 to 50 wt. % solids. The amount of PAG is preferably about 1 to 20 wt. % based on the weight of the polymer component. The amount of crosslinking agent is preferably about 1 to 30 wt. % based on the weight of the polymer component, more preferably about 5 to 0.25 wt. %. The amount of solvent is from about 5 to about 99.5 wt. %, preferably from about 60 to about 90 wt. % The other ingredients that may optionally be included in the inventive patternable low-k composition are present in amounts that are well known to those in the photoresist art.

The patternable low-k compositions of the invention may be patterned using various radiation types such as mid-UV, deep-UV (specifically 248 nm, 193 nm, and 157 nm wavelengths), extreme-UV (approximately 13 nm wavelength), x-ray, electron beam, and ion beam. The compositions may also be patterned by contact printing techniques, imprinting, embossing and nano-cutting. The appropriate radiation type(s) may depend on the components of the overall patternable low-k composition (e.g., the selection of the photosensitive acid generator, sensitizer, polymer component, etc.). The patternable low-k compositions of the invention generally provide high sensitivity (<100 mJ/cm$^2$) and high resolution (approximately 300 nm resolution or less). The PHMBS base negative-tone composition can resolve sub 200 nm patterns with a sensitivity less than 40 mJ/cm$^2$.

The patternable low-k material of the present invention is formed by applying the patternable low-k composition of the present invention to a suitable substrate, e.g., semiconductor, conductive material, insulator, or combinations, including multilayers, thereof. Specifically, the low-k composition is coated onto the substrate using art-known techniques such as spin-on coating, spray coating, brushing, dip coating or by a doctor blade. After application of the patternable low-k composition of the present invention, the low-k composition is typically heated to an elevated temperature of about 50° to about 250° C. for a short period of time of from about 1 to about 30 minutes to drive off solvent. The dried patternable low-k film thus formed generally has a thickness of from about 0.01 to about 20 microns, with a thickness of from about 0.01 to about 1 microns being more highly preferred.

The patternable low-k film is then imagewise exposed to radiation, suitably electromagnetic radiation or electron beam radiation, preferably ultraviolet radiation suitably at a wavelength of about 150-365 nm, preferably 157 nm, 193 or 248 nm. In some embodiments, EUV radiation (13 nm) may be employed. Suitable radiation sources include mercury, mercury/xenon, and xenon lamps. The preferred radiation source is an ArF excimer laser, a KrF excimer laser or a F$_2$ laser. At longer wavelengths, a sensitizer may be added to the overlying layer to enhance absorption of the radiation. The exposed material is then developed utilizing techniques well known to those skilled in the art.

After the patternable low-k film has been exposed and developed, the film is heated to an elevated temperature of from about 50° to about 250° C. for a short period of from about 1 minute to about 5 minutess. This heating step of the present invention causes a chemical transformation in the patternable low-k film, e.g., deprotection, or crosslinking, to form the desired pattern.

The patternable low-k film is then cured to convert the patternable low-k composition into a patternable low-k material. The curing is performed using either a furnace or a hot plate. The cure temperature employed in the present invention is from about 100° to about 1000° C., preferably from about 200° to about 600° C., and more preferably from about 350° to about 450° C. The time period for the curing step varies depending on the mode of curing. For example, when a hot plate is employed in curing the patternable low-k composition, the time period for curing is from about 5 seconds to about 5 hours, more preferably from about 30 seconds to about 30 minutes, and most preferably from about 2 minutes to about 30 minutes. When a furnace is employed in curing the patternable low-k composition, the time period for curing is from about 1 minute to about 20 hours, more preferably from about 10 minutes to about 10 hours, and most preferably from about 60 minutes to about 4 hours.

Figure 2A:
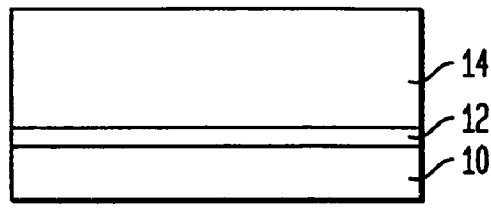
FIGS. 2A-2D are pictorial representations (though cross-sectional views) illustrating the use of the patternable low-k dielectric material of the present invention as an interconnect dielectric in dual damascene interconnects.

FIGS. 2A-2D show the use of the patternable low-k material of the present invention in forming a dual damascene interconnect structure. In this illustration, the patternable low-k material is a component of a negative-tone patternable low-k composition. FIG. 2A shows an initial structure which includes substrate 10 having a cap layer 12 and a negative-tone patternable low-k composition 14. The substrate 10 is a semiconductor material, dielectric or metal layer. While the cap layer 12 is composed of an oxide, nitride, or carbide. The cap layer 12 is applied to the substrate 10 utilizing a conventional deposition process; likewise the negative-tone patternable low-k composition 14 of the present invention is also applied by a conventional coating technique. In the present illustration, the negative-tone patternable low-k composition 14 includes porogens. A prebake step which serves to remove residual solvent may be employed after application of the negative-tone patternable low-k composition 14.

Figure 2B:
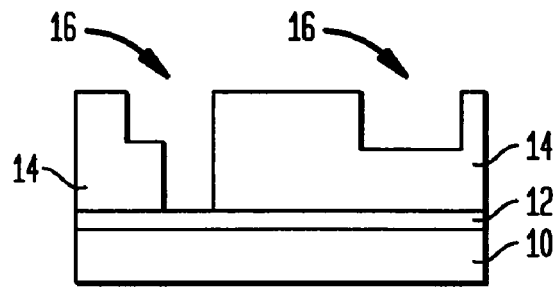
Figure 2C:
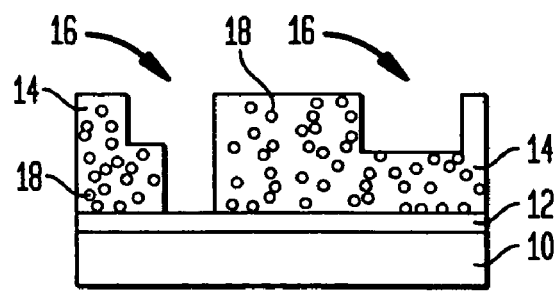

Next, and as illustrated in FIG. 2B, the negative-tone patternable low-k composition 14 is subjected to pattern-wise exposure and thereafter developed using a common developer solution, providing openings 16 in layer 14.

Figure 2D:
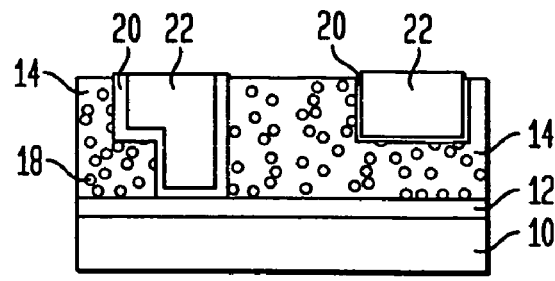

Next, the porogen in the positive-tone patternable low-k composition 14 is decomposed by conventional thermal means or by an ionizing radiation to create nano-pores 18 in the low-k composition 14; See, FIG. 2C. Note that the imaged negative-tone patternable low-k composition is converted into a patterned low-k material at this point of the present invention. FIG. 2D shows the structure after the openings 16 are lined with a liner material 20, filled with a conductive material 22 and planarized. The liner material 20 includes any material which will prevent conductive material 22 from diffusing into patternable low-k material 14. For example, liner material 20 may comprise TiN, TaN, WN, α-W or the like. The conductive material 22 is any conductor typically used in interconnect structures such as, for example, Cu, Al or W.

The above steps shown in FIGS. 2A-2D may be repeated any number of times to provide a multilayer interconnect structure.

In the present invention, the patternable low-k composition can be used in forming a film stack. The film stack of the present invention includes a substrate, a patternable low-k material of the present invention located atop the film stack and an overlying layer atop the patternable low-k material, A conductive metal, such as Cu, may be embedded within the patternable low-k material of the inventive film stack.

It is again noted that the low-k material of the present invention is capable of serving as both an interconnect dielectric as well as a photoresist; therefore the use of the low-k material of the present invention significantly reduces the complexity and cost of making interconnect structures. More specifically, conventional etching and deposition of various hard mask materials are minimized.

The present invention thus provides a composition which functions as both a photoresist material and as the interlevel or intralevel dielectric of an interconnect structure, preferably a dual damascene interconnect structure. The advantages that one can obtain for employing the patternable low-k composition and material of the present invention include: higher sensitivity, higher resolution as compared to conventional base-catalyzed silsesquioxane polymers; improved mechanical properties as compared to conventional organic and inorganic low-k materials; and better crack resistance as compared with conventional spin on organosilicates or CVD deposited organosilicates.

The following examples are provided to further describe the present invention. In some of the examples, a thermal acid generator is used to replace the photoacid generator to simulate for the exposure effect. Specifically, p-nitrobenzyl tosylate is used as a thermal acid generator. The invention is not limited to the details of the examples.

EXAMPLE 1

Synthesis of Octakis[(4-hydroxyphenethyl)dimethylsilyloxy]silsesquioxane (CSSQ HPE)

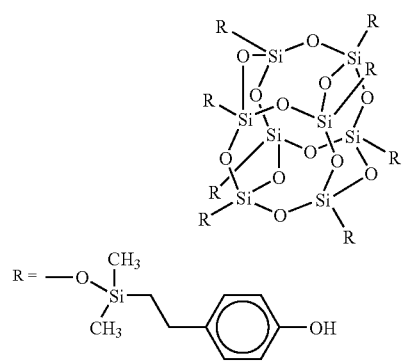

Structure 1

I. Octakis(dimethylsilyloxy)silsesquioxane($Q_8M_8^H$) (10.16 grams, 0.01 mole), 4-acetoxystyrene(16.22 g, 0.1 mole) and hexane (100 ml) were placed in a round bottom flask equipped with magnetic stirrer, nitrogen inlet, and a water condenser. Platinum(0)-1,2-divinyl-1,1,3,3-tetramethyldisiloxane complex in xylene (1 ml) was added to this mixture and stirred at room temperature. The reaction became mildly exothermic. After half an hour at room temperature, the solution was heated to reflux for 2 hours. On cooling to room temperature, material separated and settled in the bottom as a waxy solid. This material was rinsed twice with hexane (30 ml) and dried under vacuum.

II. The above material was heated to reflux with methanol (100 ml) and ammonium hydroxide (14.8 molar)(12 ml, 0.18 mole) for two hours. The progress of the reaction was monitored by IR spectroscopy. The solution was allowed to cool to room temperature and added drop wise into 5% HCl solution (1.6 liter). The product coagulated and settled in the bottom. It was separated by decantation, rinsed twice with DI water (200 ml) and dried under vacuum at 80° C.

III. This dried product was further purified by reprecipitation. It was dissolved in acetone (25 ml) and added drop wise into hexanes (250 ml). The product was then separated by decantation and dried under vacuum at 80° C. Yield=12.5 grams.

Notes: All starting materials were purchased from Aldrich Chemical Co.

EXAMPLE 2

Synthesis of Octakis[{2-(1',1'-bis(trifluoromethyl)-1'-hydroxyethyl)norbornyl}dimethylsilyloxy]silsesquioxane (Structure 2)(CSSQ NBHFA)

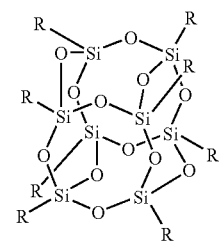

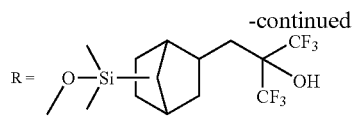

Structure 2

Using a similar procedure as in Example 1, 10.1 grams of Octakis[{2-(1',1'-bis(trifluoromethyl)-1'-hyroxyethyl) norbornyl}dimethylsilyloxy]silsesquioxane (structure 2) was prepared from Octakis(dimethylsilyloxy)silsesquioxane ($Q_8M_8^H$) (5.08 g, 0.005 mole) and 2-(1',1'-bis(trifluoromethyl)-1'-acetoxyethyl)norbornene (14.2 g, 0.045 mole).

Notes: 2-(1',1'-bis(trifluoromethyl)-1'-acetoxyethyl)norbornene was prepared from 2-(1',1'-bis(trifluoromethyl)-1'-hydroxyethyl)norbornene (Central Glass, Japan), using a standard procedure (acetylchloride and triethyl amine).

EXAMPLE 3

Poly(4-hydroxy-α-methylbenzylsilsesquioxane)(PH-MBS)

A patternable low-k composition was formulated with 1.0 g PHMBS, 0.33 g methylphenyltetramethoxymethyl glycoluril (methylphenyl POWDERLINK), 0.0925 g di(t-butylphenyl) iodonium triflate, 0.14 g of 1 wt. % coumarin-1 in propylene-glycolmonomethylether acetate (PGMEA), 0.067 g of 10% by weight surfactant (FLUORAD FC-430) in PGMEA, and 11.32 g propylene-glycolmonomethylether acetate (PGMEA) solvent. The resulting low-k formulation was filtered wafer and cured at 425° C. for 2 hours under $N_2$ atmosphere. The resultant film had a dielectric constant as measured by MIS structure of 2.99 at 23° C. The dielectric constant, electrical breakdown field of the same film cured at 400° C. had a dielectric constant of 3.4, 5 MV/cm, respectively.

EXAMPLE 4

Poly(4-hydroxy-α-methylbenzylsilsesquioxane)(PH-MBS)

A patternable low-k composition was formulated with 6.0 g PHMBS, 1.983 g methylphenyltetramethoxymethyl glycoluril (methylphenyl POWDERLINK), 0.556 g di(t-butylphenyl) iodonium perfluorooctanesulfonate, 0.855 g of 1 wt. % coumarin-1 in PGMEA, 0.400 g of 10% by weight surfactant (FLUORAD FC-430) in PGMEA, and 61.43 g propylene-glycolmonomethylether acetate (PGMEA) solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant and electrical breakdown field as measured by MIS structure of 3.06 and 3.5 MV/cm, respectively, at 23° C.

The low-k composition was then spin coated onto a 0.7 µm hard baked (170° C. for 2 minutes) 248 nm underlayer resist on a silicon wafer to obtain an about 0.2 µm thick patternable low-K film. The patternable low-K film was pre-exposure baked at 110° C. for 60 seconds, patternwise exposed to 248 nm DUV light on an ASML (0.63 NA, 5/8 annular) DUV stepper, and post-exposure baked at 110° C. for 60 seconds. This was followed by two 30 second each puddle development steps with a 0.14 N TMAH developer to resolve 0.15 µm line and space features at 16 mJ/cm².

A 1.7 um thick film of the same composition cured at 450° C. for 2 hours was measured by nano-indentation to have an elastic modulus and hardness of 5.8 GP and 0.6 GPa, respectively.

EXAMPLE 5

Poly(4-hydroxy-α-methylbenzylsilsesquioxane)(PH-MBS) Pattern Integrity

The patternable low-k composition formulated in Example 4 was spin coated onto an 8 inch silicon wafer and soft baked at 110° C. for 60 seconds to obtain an about 0.2 µm thick patternable low-K film. The patternable low-K film was patternwise exposed to 248 nm DUV light on an ASML (0.63 NA, 5/8 annular) DUV stepper, and post-exposure baked at 110° C. for 60 seconds. This was followed by two 30 second each puddle development steps with a 0.14 N TMAH developer to resolve 0.15 µm line features at 16.5 mJ/cm². The patterned film was then cured at 450° C. for 2 hours under $N_2$ atmosphere (5° C./min form room temperature to 425° C., 2.0° C./min to 450° C., all under $N_2$ atmosphere). The patterns were maintained after the curing.

EXAMPLE 6

Poly(4-hydroxy-α-methylbenzylsilsesquioxane)(PH-MBS) and Pluronics

A patternable low-k composition was formulated with 1.5 g PHMBS, 0.265 g Pluronic F88 (from BASF), 0.583 g methylphenyltetramethoxymethyl glycoluril (methylphenyl POWDERLING), 0.163 g di(t-butylphenyl) iodonium perfluorooctanesulfonate, 0.125 g of 1 wt. % coumarin-1 in PGMEA, 0.118 g of 10% by weight surfactant (FLUORAD FC-430) in PGMEA, and 20.08 g propylene-glycolmonomethylether acetate (PGMEA) solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 3.44 and 2.84 at 23° C. and 150° C., respectively.

EXAMPLE 7

Poly(4-hydroxy-α-methylbenzylsilsesquioxane)(PH-MBS) and Pluronic

The patternable low-k composition formulated in Example 6 was spin coated onto an 8 inch silicon wafer and soft baked at 110° C. for 60 seconds to obtain an about 0.3 µm thick patternable low-K film. The patternable low-K film was patternwise exposed to 248 nm DUV light on an ASML (0.63 NA, 5/8 annular) DUV stepper, and post-exposure baked at 110° C. for 60 seconds. This was followed by two 30 second each puddle development steps with a 0.14 N TMAH developer to resolve features detectable with an optical microscope.

EXAMPLE 8

CSSQ HPE

A patternable low-k composition was formulated with 3.0 g of 50 wt % CSSQ HPE synthesized in Example 1 in PGMEA, 0.177 g methyl phenyltetramethoxymethyl glycoluril (methylphenyl POWDERLINK), 0.008 g p-nitrobenzoyl tosylate, 0.212 g of 10% by weight surfactant (FLUORAD FC-430) in PGMEA, and 11.41 g propylene-glycolmonomethylether acetate (PGMEA) solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant and electrical breakdown field as measured by MIS structure of 2.71 and 3 MV/cm at 23° C., respectively.

EXAMPLE 9

Octakis[(glycidyloxypropyl)dimethylsilyloxy]silsesquioxane (CSSQ Epoxy)

A low-k composition was formulated with 3.0 g CSSQ epoxy (purchased from Tal Materials, Ann Arbor, Mich.), 0.158 g p-nitrobenzoyl tosylate, 0.20 g of 10% by weight surfactant (FLUORAD FC-430) in PGMEA, and 23.125 g propylene-glycolmonomethylether acetate (PGMEA) solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 2.65 and 2.39 at 23° C. and 150° C., respectively.

EXAMPLE 10

Poly(2-trifluoromethyl-2-hydroxy-ethylsilsesquioxane-co-2-(1',1'-bis(trifluoromethyl)-1'-hydroxyethyl)norbornylsilsesquioxane)(TFA-NBHFA 6/4)

A patternable low-k composition was formulated with 2.0 g TFA/NBHFA SSQ, 0.661 g methyl phenyltetramethoxymethyl glycoluril (methylphenyl POWDERLINK), 0.184 g di(t-butylphenyl) iodonium perfluorooctanesulfonate, 0.285 g of 1 wt. % coumarin-1 in PGMEA, 0.133 g of 10% by weight surfactant (FLUORAD FC-430) in PGMEA, and 20.48 g propylene-glycolmonomethylether acetate (PGMEA) solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 3.05 at 23° C., respectively.

EXAMPLE 11

Poly(2-trifluoromethyl-2-hydroxy-ethylsilsesquioxane-co-2-(1',1'-bis(trifluoromethyl)-1'-hydroxyethyl)norbornylsilsesquioxane)(TFA-NBHFA 6/4)

The patternable low-k composition formulated in Example 10 was spin coated onto an 8 inch silicon wafer and soft baked at 110° C. for 60 seconds to obtain a patternable low-K film. The patternable low-K film was patternwise exposed to 248 nm DUV light on an ASML (0.63 NA, 5/8 annular) DUV stepper, and post-exposure baked at 110° C. for 60 seconds. This was followed by two 30 second each puddle development steps with a 0.26 N TMAH developer to resolve features detectable with an optical microscope.

EXAMPLE 12

CSSQ HPE and Pluronics

A low-k composition was formulated with 3.0 g of 50 wt. % CSSQ HPE in PGMEA, 0.375 g Pluronic F88, 0.221 g methylphenyltetramethoxymethyl glycoluril (methylphenyl POWDERLINK), 0.110 g p-nitrobenzyl tosylate, 0.221 g of 1 wt. % coumarin-1 in PGMEA, 0.125 g of 10% weight surfactant (FLUORAD FC-430) in PGMEA, and 16.139 g Downol PM solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 2.84 and 2.68 at 23° C. and 150° C., respectively.

EXAMPLE 13

CSSQ Epoxy and Pluronics

A low-k composition was formulated with 3.0 g of CSSQ EP, 0.75 g Pluronic F88, 0.442 g methylphenyltetramethoxymethyl glycoluril (methylphenyl POWDERLINK), 0.221 g p-nitrobenzyl tosylate, 0.442 g of 1 wt. % comarin-1 in PGMEA, 0.25 g of 10% by weight surfactant (FLUORAD FC-430) in PGMEA, and 35.277 g Downol PM solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 2.25 and 2.14 at 23° C. and 150° C., respectively.

EXAMPLE 14

CSSQ Epoxy and Pluronics

A low-k composition was formulated with 3.0 g of CSSQ EP, 0.333 g Pluronic F88, 0.393 g methylphenyltetramethoxymethyl glycoluril (methylphenyl POWDERLINK), 0.196 g p-nitrobenzyl tosylate, 0.393 g of 1 wt. % coumarin-1 in PGMEA, 0.222 g of 10% by weight surfactant (FLUORAD FC-430) in PGMEA, and 21.78 g Downol PM solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 2.82 and 2.60 at 23° C. and 150° C., respectively.

EXAMPLE 15

CSSQ Epoxy and Pluronics

A low-k composition was formulated with 3.0 g of CSSQ EP, 1.286 g Pluronic F88, 0.505 g methylphenyltetramethoxymethyl glycoluril (methylphenyl POWDERLINK), 0.252 g p-nitrobenzyl tosylate, 0.505 g of 1 wt. % coumarin-1 in PGMEA, 0.286 g of 10% by weight surfactant (FLUORAD FC-430) in PGMEA, and 28.01 g Downol PM solvent. The resulting low-k formulation was filtered through a 0.2 µm filter. The low-k composition was then spin coated onto an 8 inch silicon wafer and cured at 450° C. for 2 hours under $N_2$ atmosphere. The resultant film had a dielectric constant as measured by MIS structure of 2.55 and 2.38 at 23° C. and 150° C., respectively.

EXAMPLE 16

CSSQ Epoxy and Pluronics

A patternable low-k composition was formulated with 3.0 g of CSSQ EP, 2.0 g Pluronic F88, 0.589 g methylphenyltetramethoxymethyl glycoluril (methylphenyl POWDERLINK), 0.294 g p-nitrobenzyl tosylate, 0.589 g of 1 wt. % coumarin-1 in PGMEA, 0.333 g of 10% by weight surfactant (FLUORAD FC-430) in PGMEA, and 32.68 g Downol PM solvent. The resulting low-k formulation was filtered through a 0.2 μm filter. The low-k composition was then spin coated onto an 8 inch silicon wafer and cured at 450° C. for 2 hours under $N_2$ atmosphere. The resultant film had a dielectric constant as measured by MIS structure of 2.52 and 2.40 at 23° C. and 150° C., respectively.

EXAMPLE 17

CSSQ HPE and Pluronics

A low-k composition was formulated with 2.0 g of 50 wt. % CSSQ HPE in PGMEA, 0.330 g methylphenyltetramethoxymethyl glycoluril (methylphenyl POWDERLINK), 0.093 g di(t-butylphenyl) iodonium perfluorooctanesulfonate, 0.142 g of 1 wt. % coumarin-1 in PGMEA, 0.133 g of 10% by weight surfactant (FLUORAD FC-430) in PGMEA, and 9.17 g propylene-glycolmonomethylether acetate (PGMEA) solvent. The resulting low-k formulation was filtered through a 0.2 μm filter. The low-k composition was then spin coated onto an 8 inch silicon wafer and cured at 450° C. for 2 hours under $N_2$ atmosphere. The resultant film had a dielectric constant as measured by MIS structure of 3.23 and 2.98 at 23° C. and 150° C., respectively.

EXAMPLE 18

CSSQ Epoxy and PPO-EP

A low-k composition was formulated with 2.0 g of CSSQ EP, 0.5 g epoxide terminated poly(propylene oxide)(Purchased from Aldrich), 0.132 g p-nitrobenzyl tosylate, 0.167 g of 10% by weight surfactant (FLUORAD FC-430) in PGMEA, and 9.24 g Downol PM solvent. The resulting low-k formulation was filtered through a 0.2 μm filter. The low-k composition was then spin coated onto an 8 inch silicon wafer and cured at 450° C. for 2 hours under $N_2$ atmosphere. The resultant film had a dielectric constant as measured by MIS structure of 2.28 at 150° C.

EXAMPLE 19

CSSQ Epoxy and Pluronics

A low-k composition was formulated with 2.0 g of CSSQ EP, 0.5 g Pluronic F88, 0.132 g p-nitrobenzyl tosylate, 0.167 g of 10% by weight surfactant (FLUORAD FC-430) in PGMEA, and 9.24 g Downol PM solvent. The resulting low-k formulation was filtered through a 0.2 μm filter. The low-k composition was then spin coated onto an 8 inch silicon wafer and cured at 450° C. for 2 hours under $N_2$ atmosphere. The resultant film had a dielectric constant as measured by MIS structure of 2.29 at 150° C.

While the invention has been particularly shown and described with reference to preferred embodiments thereof, it will be understood by those skilled in the art that various changes in form and details may be made therein without departing from the spirit and scope of the invention. It is therefore intended that the present invention is not limited to the exact forms and details described and illustrated, but fall within the scope of the appended claims.

What is claimed is:

1. A method of forming a patterned interconnect structure comprising:
   (a) providing a structure including a cap layer atop a substrate;
   (b) applying a patternable low-k composition comprising a functionalized polymer having one or more acid-sensitive imageable groups, wherein said functional polymer has a dielectric constant of less than 3.9 and said functionalized polymer is a caged silsesquioxane polymer including combinations thereof having the formula:

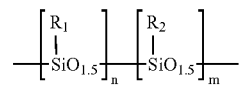

wherein each occurrence of $R_1$ is independently one or more acidic functional groups for base solubility; each occurrence of $R_2$ independently comprises at least one acid-sensitive imageable functional group for crosslinking; $R_1$ is not equal to $R_2$; m and n represent the number of repeating units; m is an integer; and n is zero or an integer greater than zero, wherein said acid-sensitive imageable functional group for crosslinking is selected from a linear or branched alkyl that is substituted with at least one of —OH, epoxide, and —F; a cycloalkyl which is substituted wit at least one of —OH, epoxide, and —F; a cyclo aromatic that is substituted with at least one of —OH, epoxide, and —F; or an arene that is substituted with at least one of —OH, epoxide, and —F onto said cap layer;
   (c) forming via and/or line patterns in said paternable low-k composition;
   (d) curing said patternable low-k composition to convert said composition into a patternable low-k material; and
   (e) filling said via/or line patterns with at least a conductive material.

2. The method of claim 1 wherein each occurrence of $R_1$ independently comprises a linear or branched alkyl which is substituted with at least one of OH, —C(O)OH, and F; a cycloalkyl which is substituted with at least one of —OH, —C(O)OH and —F; an aromatic which is substituted with at least one of —OH, —C(O)OH, and —F; an arene that is substituted with at least one of OH, —C(O)OH and —F; or an acrylic that is substituted with at least one of —OH, —C(O)OH and —F.

3. The method of claim 1 wherein each occurrence of $R_1$ independently is one of the formula moieties:

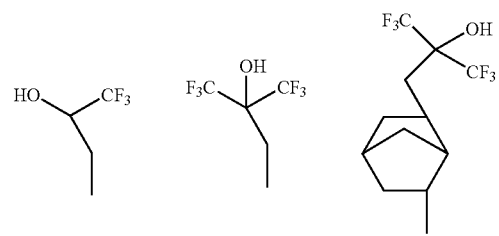

-continued

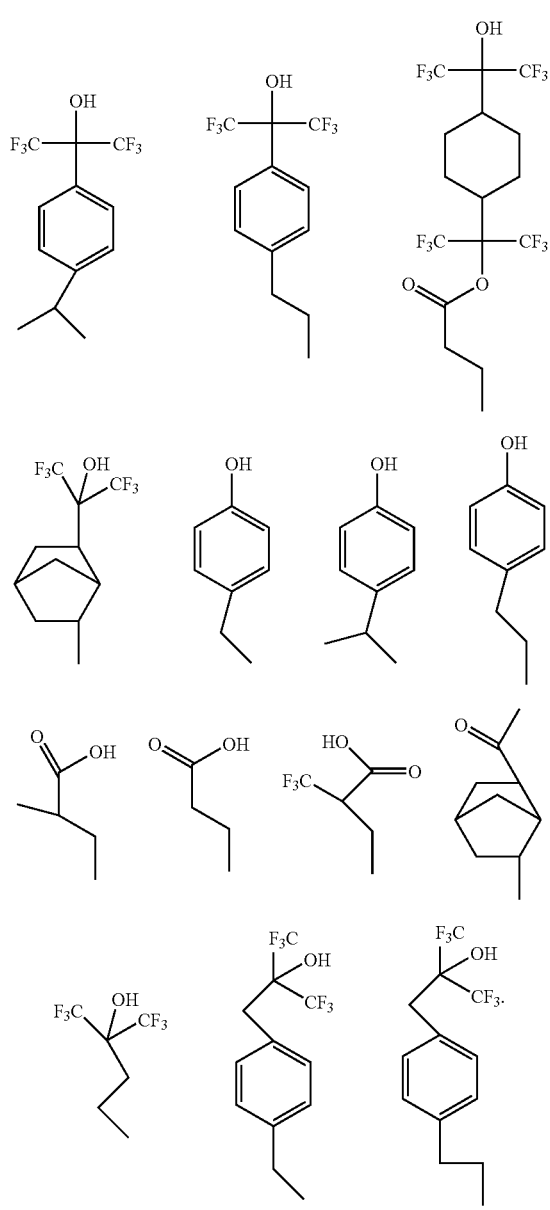

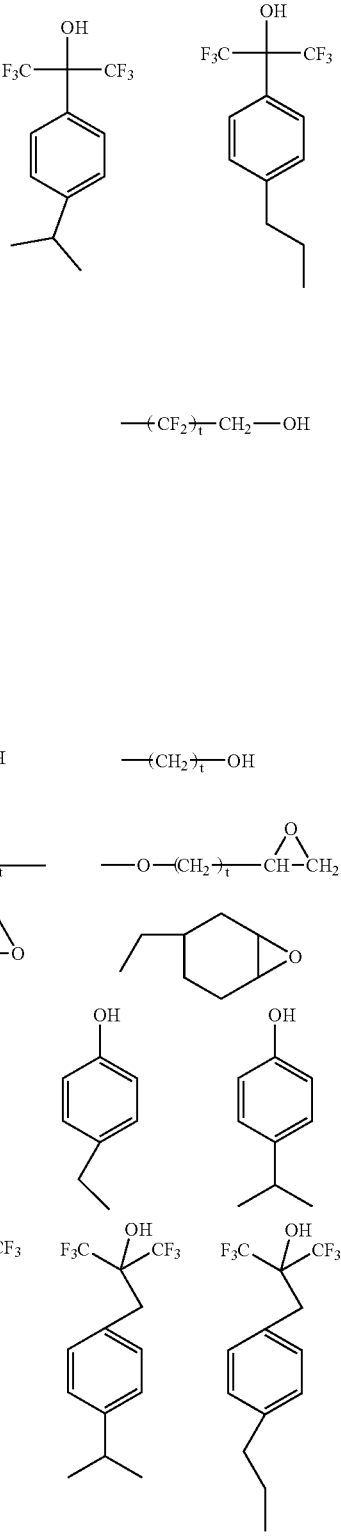

4. The method of claim 1 wherein each occurrence of $R_2$ independently is one or more acid-sensitive functional groups for crosslinking.

5. The method of claim 1 wherein each occurrence of $R_2$ independently comprises one of the following:

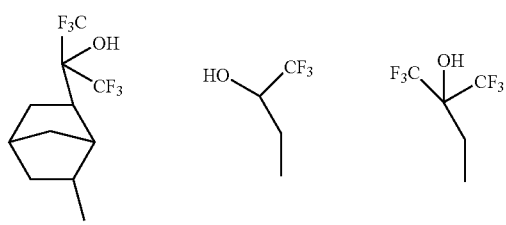

wherein $R^{10}$ is any $R_2$ group and t is from 1 to 20.

6. The method of claim 1 wherein $R_2$ further comprises an acid-sensitive protecting group.

7. The method of claim 6 wherein said acid-sensitive protecting group comprises cyclic or branched aliphatic carbonyls, tertiary esters, or tertiary ethers.

8. The method of claim 7 wherein said $R_2$ is one of the following moieties:

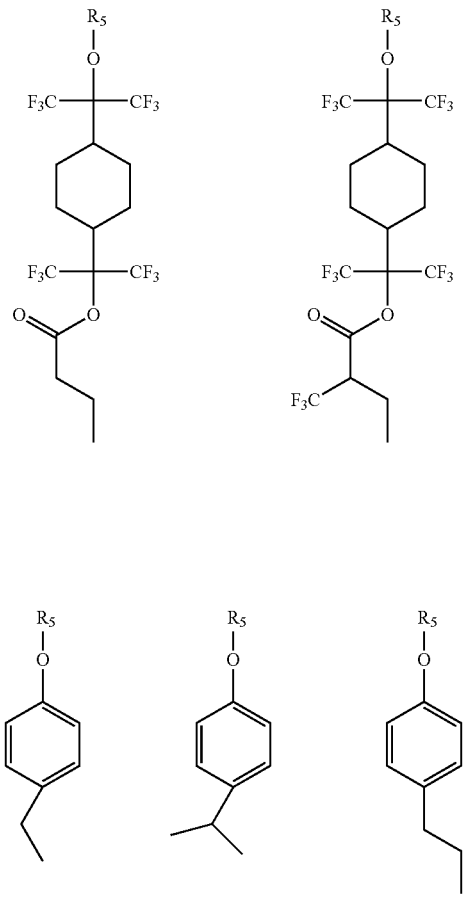
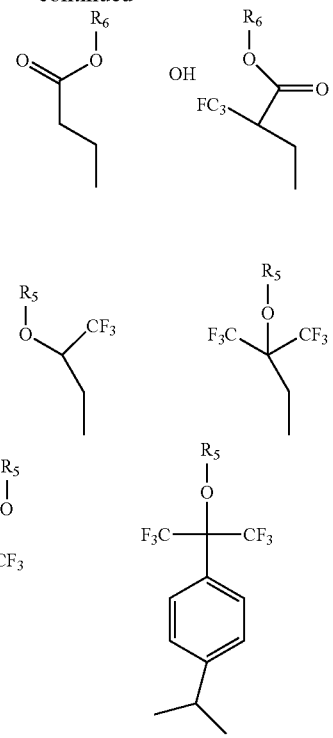

wherein $R_5$ and $R_6$ cyclic or branched aliphatic carbonyls, tertiary esters, or tertiary ethers.

9. The method of claim 1 wherein said patternable low k composition further comprises a photosensitive acid generator and a solvent.

10. The method of claim 9 further comprising an acid sensitive crosslinking agent.

* * * * *